(12) United States Patent
Choi

(10) Patent No.: US 12,500,578 B2
(45) Date of Patent: Dec. 16, 2025

(54) VOLTAGE GENERATOR AND CLOCK GENERATION CIRCUIT INCLUDING THE SAME

(71) Applicant: SK hynix Inc., Icheon-si (KR)

(72) Inventor: Eun Jung Choi, Icheon-si (KR)

(73) Assignee: SK hynix Inc., Gyeonggi-do (KR)

( * ) Notice: Subject to any disclaimer, the term of this patent is extended or adjusted under 35 U.S.C. 154(b) by 55 days.

(21) Appl. No.: 18/545,474

(22) Filed: Dec. 19, 2023

(65) Prior Publication Data
US 2024/0380390 A1    Nov. 14, 2024

(30) Foreign Application Priority Data
May 10, 2023    (KR) .................... 10-2023-0060575

(51) Int. Cl.
*H03K 3/011*    (2006.01)
*H03K 5/24*    (2006.01)
*H03K 17/687*    (2006.01)

(52) U.S. Cl.
CPC ............. *H03K 3/011* (2013.01); *H03K 5/24* (2013.01); *H03K 17/6871* (2013.01)

(58) Field of Classification Search
None
See application file for complete search history.

(56) References Cited

U.S. PATENT DOCUMENTS

| | | | |
|---|---|---|---|
| 6,020,792 A * | 2/2000 | Nolan ................ | H03K 3/0231 331/111 |
| 6,356,161 B1 * | 3/2002 | Nolan ................ | H03K 3/011 331/74 |
| 8,508,306 B2 * | 8/2013 | Choe ................ | H03K 4/502 331/111 |
| 8,922,289 B2 | 12/2014 | Mitsuda et al. | |
| 10,671,104 B2 | 6/2020 | Mikhael | |

* cited by examiner

*Primary Examiner* — Kenneth B Wells
(74) *Attorney, Agent, or Firm* — WILLIAM PARK AND ASSOCIATES LTD.

(57) ABSTRACT

A clock generation circuit includes a reference voltage generator configured to generate a first current having a current value inversely proportional to a reference voltage and a temperature, a bias circuit configured to generate a bias current, a second current having a current value proportional to the temperature, and a third current based on the reference voltage, a voltage generator configured to generate a supply voltage based on the first current, the bias current, and the second current, and an oscillation circuit configured to generate a clock signal having a constant frequency based on the supply voltage and the third current, wherein the supply voltage is generated to have a slope based on a ratio of the first current to the second current.

20 Claims, 8 Drawing Sheets

VOLTAGE GENERATOR AND CLOCK GENERATION CIRCUIT INCLUDING THE SAME

CROSS-REFERENCE TO RELATED APPLICATION

This patent document claims the priority to, and benefits of Korean patent application No. 10-2023-0060575, filed on May 10, 2023, in the Korean Intellectual Property Office, which is hereby incorporated by reference in its entirety as part of the disclosure of this patent document.

TECHNICAL FIELD

The technology and implementations disclosed in this patent document generally relate to a voltage generator having a process, voltage, and temperature (PVT) compensation function, and a clock generation circuit including the same.

BACKGROUND

Recently, demand for high definition, high resolution, multifunction, and high speed integrated circuits (ICs) has been rapidly increasing, and each of the integrated circuits (ICs) requires various operation frequencies for driving internal circuits. The integrated circuit (IC) may include an oscillator to provide a high operation frequency clock to internal circuitry. In order for the oscillator to output a stable clock, three factors must be simultaneously compensated for external changes to a power-supply voltage, temperature, and process. Since the frequency of a clock generated by the oscillator affects the operation of other internal circuits, the oscillator must provide a clock having a constant frequency regardless of changes in process, temperature, and power-supply voltage. Oscillators are required to have low-power configurations and low-cost structures with low battery consumption to be implemented in integrated circuits or the like while having high precision and high stability in their outputs.

SUMMARY

In accordance with an embodiment of the disclosed technology, a clock generation circuit may include a reference voltage generator configured to generate a first current having a current value inversely proportional to a reference voltage and a temperature; a bias circuit configured to generate a bias current, a second current having a current value proportional to the temperature, and a third current based on the reference voltage; a voltage generator configured to generate a supply voltage based on the first current, the bias current, and the second current; and an oscillation circuit configured to generate a clock signal having a constant frequency based on the supply voltage and the third current, wherein the supply voltage is generated to have a slope based on a ratio of the first current to the second current.

In accordance with another embodiment of the disclosed technology, a voltage generator may include a comparator configured to compare a bias voltage with a feedback voltage received from a feedback node; a first drive element, connected between a power-supply-voltage input terminal and an output node of a supply voltage, configured to control the supply voltage based on an output signal of the comparator; a first resistor connected between the first drive element and the feedback node; a second resistor connected between the feedback node and a ground voltage terminal; a first constant current source, connected between the feedback node and the ground voltage terminal, configured to generate a constant current by using the first current; and a second constant current source, connected between the feedback node and the ground voltage terminal, configured to generate a constant current by using the second current.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
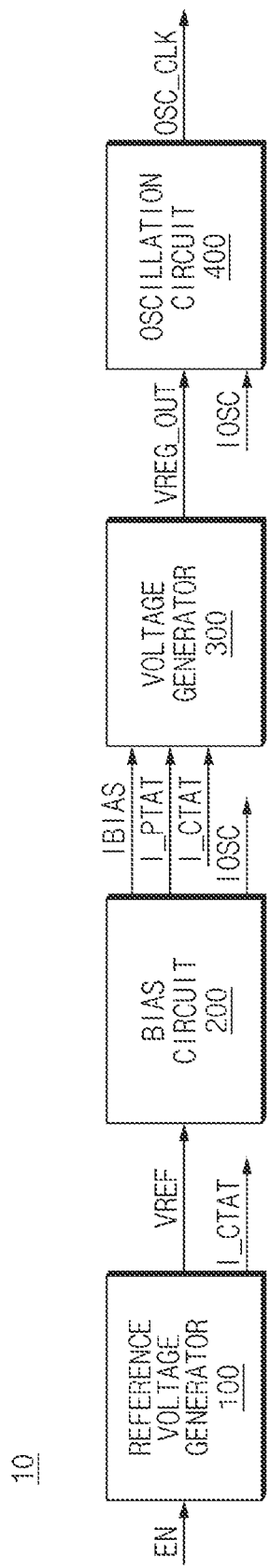
FIG. 1 is a block diagram illustrating an example of a clock generation circuit based on implementations of the disclosed technology.

This patent document provides implementations and examples of a voltage generator having a process, voltage, and temperature (PVT) compensation function and a clock generation circuit including the same that may be used in configurations to substantially address one or more technical or engineering issues and to mitigate limitations or disadvantages encountered in other comparators and image sensing devices. Implementations of the disclosed technology relate to a voltage generator capable of generating a clock signal having a constant frequency regardless of changes in process, voltage, and temperature (PVT), and a clock generation circuit including the same. In recognition of the issues above, the voltage generator and the clock generation circuit including the same based on implementations of the disclosed technology can efficiently reduce frequency fluctuation of a clock signal affected by process, voltage, and temperature (PVT) changes.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Various embodiments of the disclosed technology relate to a voltage generator capable of generating a clock signal having a constant frequency regardless of changes in process, voltage, and temperature (PVT), and a clock generation circuit including the same.

FIG. 1 is a block diagram illustrating an example of a clock generation circuit 10 based on an implementation of the disclosed technology.

Referring to FIG. 1, the clock generation circuit 10 based on implementations of the disclosed technology may include a reference voltage generator 100, a bias circuit 200, a voltage generator 300, and an oscillation circuit 400.

The reference voltage generator 100 may generate a reference voltage VREF and a first current I_CTAT that are used to generate a clock signal in response to an enable signal EN. Here, the first current I_CTAT may have Complementary-To-Absolute-Temperature CTAT characteristics (i.e., characteristics inversely proportional to temperature) with respect to an absolute temperature.

The reference voltage generator 100 may generate a reference voltage VREF having a constant voltage level regardless of process, voltage, or temperature PVT changes. For example, the reference voltage generator 100 may include a bandgap reference circuit. Here, the bandgap reference circuit may refer to a circuit that supplies a reference voltage or a reference current having a predetermined level that is not affected by power-supply voltage fluctuations, temperature changes, and process variations due to output characteristics in which a negative (−) temperature coefficient and a positive (+) temperature coefficient are offset by each other.

In addition, the bias circuit 200 may generate a bias current IBIAS, a second current I_PTAT, and a third current IOSC in response to the reference voltage VREF received from the reference voltage generator 100. Here, the bias current IBIAS and the second current I_PTAT may be provided as a current source for the voltage generator 300, and the third current IOSC may be provided as a current source for the oscillation circuit 400. The second current I_PTAT may have Proportional-To-Absolute-Temperature PTAT characteristics (i.e., characteristics proportional to temperature) with respect to an absolute temperature. In addition, the bias circuit 200 may control the third current IOSC so that a maximum swing width of the output signals of the oscillation circuit 400 can be determined based on the reference voltage VREF, thereby generating a stable bias current regardless of a supply power.

The voltage generator 300 may generate a supply voltage VREG_OUT required to drive the oscillation circuit in response to the first current I_CTAT received from the reference voltage generator 100 and the bias current IBIAS and the second current I_PTAT received from the bias circuit 200. That is, in order to stably implement the frequency of the oscillation circuit 400, the voltage generator 300 may control a current flowing through an output terminal of the supply voltage VREG_OUT and thus may generate the supply voltage VREG_OUT having a slope that decreases to a predetermined level in response to the increasing temperature.

The voltage generator 300 based on implementations of the disclosed technology may combine the first current I_CTAT inversely proportional to temperature with the second current I_PTAT proportional to temperature, so that the voltage generator 300 can generate the supply voltage VREG_OUT that is not affected by PVT (process, voltage, and temperature) changes due to offset characteristics in which temperature coefficients of the first and second currents I_CTAT and I_PTAT are offset by each other.

The oscillation circuit 400 may refer to a device for continuously generating a periodic signal having a constant frequency. The oscillation circuit 400 may generate a clock signal OSC_CLK based on the supply voltage VREG_OUT received from the voltage generator 300 and the third current IOSC received from the bias circuit 200. The clock signal OSC_CLK generated by the oscillation circuit 400 may be transferred to a logic circuit (not shown) that operates in synchronization with a reference clock or in synchronization with a clock generated from the reference clock.

The oscillation circuit 400 based on implementations of the disclosed technology may generate a clock signal OSC_CLK having an operation frequency that can be maintained constant regardless of process, voltage, and temperature (PVT) changes, upon receiving the supply voltage VREG_OUT received from the voltage generator 300.

Detailed circuits and operations of the clock generation circuit 10 having the above-described constituent elements will be described in detail with reference to FIGS. 2 to 7.

Figure 2:
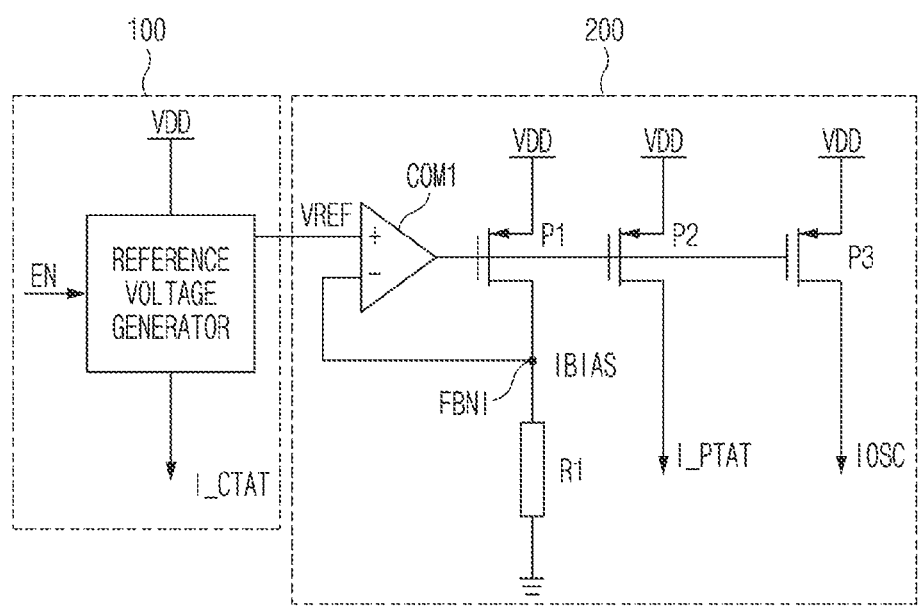
FIG. 2 is a detailed circuit diagram illustrating an example of a reference voltage generator and a bias circuit of FIG. 1 based on implementations of the disclosed technology.

FIG. 2 is a detailed circuit diagram illustrating an example of the reference voltage generator 100 and the bias circuit of FIG. 1 based on implementations of the disclosed technology.

Referring to FIG. 2, the reference voltage generator 100 may generate a reference voltage VREF and a first current I_CTAT based on an enable signal EN. That is, the reference voltage generator 100 may generate a constant reference voltage VREF according to a power-supply voltage VDD, and may output the constant reference voltage VREF to the bias circuit 200. Also, the reference voltage generator 100 may generate a first current I_CTAT that is inversely proportional to the temperature change and may output the first current I_CTAT to the voltage generator 300.

Also, the bias circuit 200 may generate a bias current IBIAS, a second current I_PTAT, and a third current IOSC in response to the reference voltage VREF. The bias circuit 200 may include a comparator COM1, a plurality of PMOS transistors P1~P3 (e.g., a plurality of drive elements), and a resistor R1.

Here, the reference voltage VREF may be applied to a first input terminal (+) of the comparator COM1, and a voltage of a feedback node FBN1 may be applied to a second input terminal (−) of the comparator COM1. The comparator COM1 may compare the reference voltage VREF with the voltage of the feedback node FBN1 and may output the result of such comparison. As the voltage of the feedback node FBN1 is fed back to the second input terminal (−) of the comparator COM1, the variation of the bias current IBIAS can be reflected in the output signal of the comparator COM1. Thus, since the bias circuit 200 can control the amount of the bias current IBIAS flowing from a power-supply voltage VDD input terminal to the feedback node FBN1 in response to the output signal of the comparator COM1, the bias circuit 200 may generate a constant bias current IBIAS by sensing a change in the power-supply voltage VDD.

A PMOS transistor P1 may be connected between the power-supply voltage VDD input terminal and the resistor R1 so that a gate terminal of the PMOS transistor P1 can be connected to the output terminal of the comparator COM1. Also, the resistor R1 may be connected between the feedback node FBN1 and a ground voltage terminal. A bias current IBIAS may be generated through the feedback node FBN1 between the PMOS transistor P1 and the resistor R1.

A PMOS transistor P2 may be connected between the power-supply voltage VDD input terminal and the output terminal of the second current I_PTAT so that a gate terminal of the PMOS transistor P2 may be connected to the output terminal of the comparator COM1. Based on the voltage to be applied to the gate-to-source terminals of the PMOS transistor P2, a value (i.e., a value of the second current I_PTAT) of a current flowing through the drain-to-source terminals of the PMOS transistor P2 may be determined. The PMOS transistor P3 may be connected between the power-supply voltage VDD input terminal and the output terminal of the third current IOSC so that a gate terminal of the PMOS transistor P3 may be connected to the output terminal of the comparator COM1. In the PMOS transistor P3, a value (i.e., a value of the third current IOSC) of a current flowing from the drain terminal to the source terminal may be determined based on a voltage received in the direction from the gate terminal to the source terminal.

Figure 3:
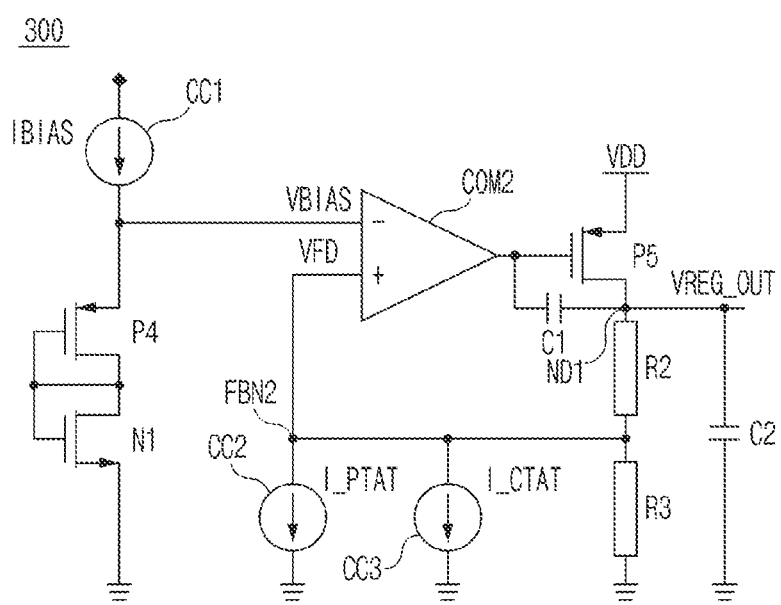
FIG. 3 is a detailed circuit diagram illustrating an example of a voltage generator of FIG. 1 based on implementations of the disclosed technology.
Figure 4:
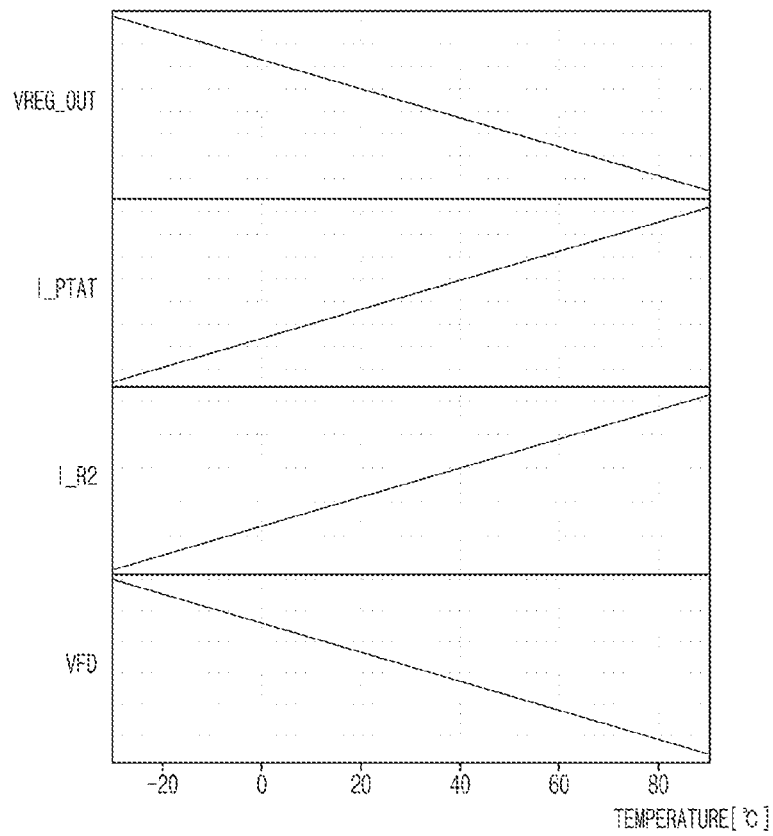
FIG. 4 is a diagram illustrating an example of changes in current and voltage in response to temperature in a voltage generator of FIG. 3 based on implementations of the disclosed technology.

FIG. 3 is a detailed circuit diagram illustrating an example of the voltage generator 300 of FIG. 1 based on implementations of the disclosed technology. FIG. 4 is a diagram illustrating an example of changes in current and voltage in response to temperature in the voltage generator 300 of FIG. 3 based on implementations of the disclosed technology.

Referring to FIG. 3, the voltage generator 300 may include a plurality of constant current sources CC1~CC3, a PMOS transistor P4, a PMOS transistor P5 (e.g., a drive element), an NMOS transistor N1, and a comparator COM2, a plurality of resistors R2 and R3, and a plurality of capacitors C1 and C2.

Here, a constant current source CC1 may generate a constant current by using the bias current IBIAS received from the bias circuit 200. The voltage of a common node of the constant current source CC1 and the PMOS transistor P4 may be provided as the bias voltage VBIAS to the first input terminal (−) of the comparator COM2.

The PMOS transistor P4 and the NMOS transistor N1 may be connected in series between the constant current source CC1 and the ground voltage terminal. Each of the PMOS transistor P4 and the NMOS transistor N1 may have a gate terminal commonly connected to a drain terminal. Gate terminals of the PMOS transistor P4 and the NMOS transistor N1 may be connected to each other.

Each of the PMOS transistor P4 and the NMOS transistor N1 may have a body bias structure and may operate in a sub-threshold region. When the drain terminal of the MOS transistor is commonly connected to the gate terminal of the MOS transistor, the MOS transistor may operate like a diode, so that each of the PMOS transistor P4 and NMOS transistor N1 can be connected in a so-called "diode connected" structure. When each of the PMOS transistor P4 and the NMOS transistor N1 is connected in a diode-connected structure, the PMOS transistor P4 and the NMOS transistor N1 may have a constant current amount regardless of a change in temperature.

In addition, the voltage generator 300 may implement the PMOS transistor P4 and the NMOS transistor N1 in a manner in which the supply voltage VREG_OUT can be generated by reflecting characteristics of the inverters (i.e., PMOS transistor and NMOS transistor) included in the oscillation circuit 400. Accordingly, the voltage generator 300 may reflect the characteristics of the inverter when the supply voltage VREG_OUT is generated by the PMOS transistor P4 and the NMOS transistor N1.

The comparator COM2 may transmit a bias voltage (VBIAS) to the first input terminal (−) and may transmit a feedback voltage VFD to the second input terminal (+). Here, the bias voltage VBIAS may be a voltage corresponding to the bias current IBIAS. The comparator COM2 may compare the bias voltage VBIAS with the feedback voltage VFD and may output the result of such comparison.

Also, the constant current source CC2 may generate a constant current by using the second current I_PTAT received from the bias circuit 200. That is, the constant current source CC2 may provide the feedback node FBN2 with the second current I_PTAT having characteristics directly proportional to temperature change. The constant current source CC2 may be connected between the feedback node FBN2 and the ground voltage terminal.

The constant current source CC3 may generate a constant current by using the first current I_CTAT received from the reference voltage generator 100. That is, the constant current source CC3 may provide the feedback node FBN2 with the first current I_CTAT being inversely proportional to the temperature change. The constant current source CC3 may be connected between the feedback node FBN2 and the ground voltage terminal. The constant current source CC2 and the constant current source CC3 may be connected in common to the feedback node FBN2 and may be connected in parallel with each other.

The PMOS transistor P5 may be connected between the power-supply voltage VDD input terminal and the output node ND1 so that a gate terminal of the PMOS transistor P5 can be connected to the output terminal of the comparator COM2. In addition, the resistors R2 and R3 for voltage division may be connected in series between the node ND1 and the ground voltage terminal. The resistor R2 may be connected between the output node ND1 and the feedback node FBN2. The resistor R3 may be connected between the feedback node FBN2 and the ground voltage terminal. The supply voltage VREG_OUT may be generated through the output node ND1 between the PMOS transistor P5 and the resistor R2.

In addition, a capacitor C1 may be connected between the output terminal of the comparator COM2 and the output node ND1. The capacitor C1 may perform a function that stores a current received from the output terminal of the comparator COM2. Also, the capacitor C2 may be connected between the output node ND1 and the ground voltage terminal. The capacitor C2 may perform a function that stores a current received from the output node ND1.

FIG. 4 is a diagram illustrating an example of changes in current and voltage in response to temperature in the voltage generator 300 of FIG. 3 based on implementations of the disclosed technology.

Referring to FIG. 4, the comparator COM2 may compare the bias voltage VBIAS with the feedback voltage VFD to detect an output change of the bias voltage VBIAS. The output voltage of the comparator COM2 may be controlled so that the level of the feedback voltage VFD gradually becomes equal to the level of the bias voltage VBIAS.

The PMOS transistor P5 may provide the output node ND1 with the supply voltage VREG_OUT corresponding to the power-supply voltage VDD in response to the output signal of the comparator COM2. For example, the PMOS transistor P5 may form a current path between the power-supply voltage VDD input terminal and the output node ND1 when the output signal of the comparator COM2 is at a first logic level (e.g., a low level).

The supply voltage VREG_OUT provided to the output node ND1 may be voltage-divided (i.e., dividing the voltage) by the resistors R2 and R3 and may be fed back to the input terminal of the comparator COM2 as the feedback voltage VFD. The feedback voltage VFD may be generated by voltage-dividing the voltage level of the output node ND1 according to a resistance value of the resistor R2 and a resistance value of the resistor R3.

The voltage generator 300 may be configured such that a constant current source CC2 and a constant current source CC3 are connected in parallel to the feedback node FBN2. The second current I_PTAT flowing through the constant current source CC2 and the first current I_CTAT flowing through the constant current source CC3 may have different temperature characteristics, for example, different temperature coefficients. That is, the voltage generator 300 may generate the supply voltage VREG_OUT by using two currents having different temperature characteristics so that the voltage generator 300 can more stably cope with temperature changes.

For example, the amount of the second current I_PTAT flowing through the constant current source CC2 having positive (+) temperature coefficient characteristics may increase in response to the increasing temperature and may decrease in response to the decreasing temperature. On the other hand, the amount of the first current I_CTAT flowing through the constant current source CC3 having negative (−) temperature coefficient characteristics may decrease in response to the increasing temperature and may increase in response to the decreasing temperature.

The supply voltage VREG_OUT output from the voltage generator 300 may be adjusted as shown in Equation 1 below and may be output to have a specific slope (i.e., a slope that is constantly decreased as the temperature increases). In Equation 1 below, it is assumed that the value of the second current I_PTAT is greater than the value of the first current I_CTAT.

$$VREG\_OUT=(I\_PTAT+I\_CTAT) \times R2 + (R2/R3+1) \times VFD \quad \text{[Equation 1]}$$

As can be seen from Equation 1, a first value may be obtained by multiplying the sum of the first current I_CTAT and the second current I_PTAT by the resistance value of the resistor R2, a second value may be obtained by multiplying the voltage division value (R2/R3+1) of the resistors R2 and R3 by the feedback voltage VFD, and the value of the supply voltage VREG_OUT can be obtained by the sum of the first value and the second value.

Accordingly, the first current I_CTAT having characteristics inversely proportional to temperature and the second current I_PTAT having characteristics proportional to temperature may be added at the feedback node FBN2, and the current I_R2 flowing through the resistor R2 may be adjusted based on the sum of the first current I_CTAT and the second current I_PTAT.

The feedback voltage VFD may be adjusted in response to the reference voltage VREF having a constant level, and the supply voltage VREG_OUT may be adjusted by the sum of the feedback voltage VFD and the voltage (e.g., V_R2) flowing through the resistor R2. Accordingly, the voltage V_R2 may be adjusted by the ratio between the first current I_CTAT and the second current I_PTAT. That is, the voltage generator 300 may generate the supply voltage VREG_OUT having a slope that is constantly decreased in response to the increasing temperature by increasing or decreasing the voltage V_R2 in response to a temperature change according to the ratio of the first current I_CTAT to the second current I_PTAT.

In order to generate the clock signal OSC_CLK having a target frequency in the oscillation circuit 400, the level of the supply voltage VREG_OUT must be stably maintained regardless of PVT changes. Therefore, the voltage generator 300, based on implementations of the disclosed technology, may control the voltage level of the feedback node FBN2 by adjusting the ratio of two complementary currents (i.e., the first current I_CTAT inversely proportional to temperature and the second current I_PTAT proportional to temperature) such that the voltage generator 300 can enable the supply voltage VREG_OUT to have a slope of a desired target level regardless of PVT changes.

Figure 5:
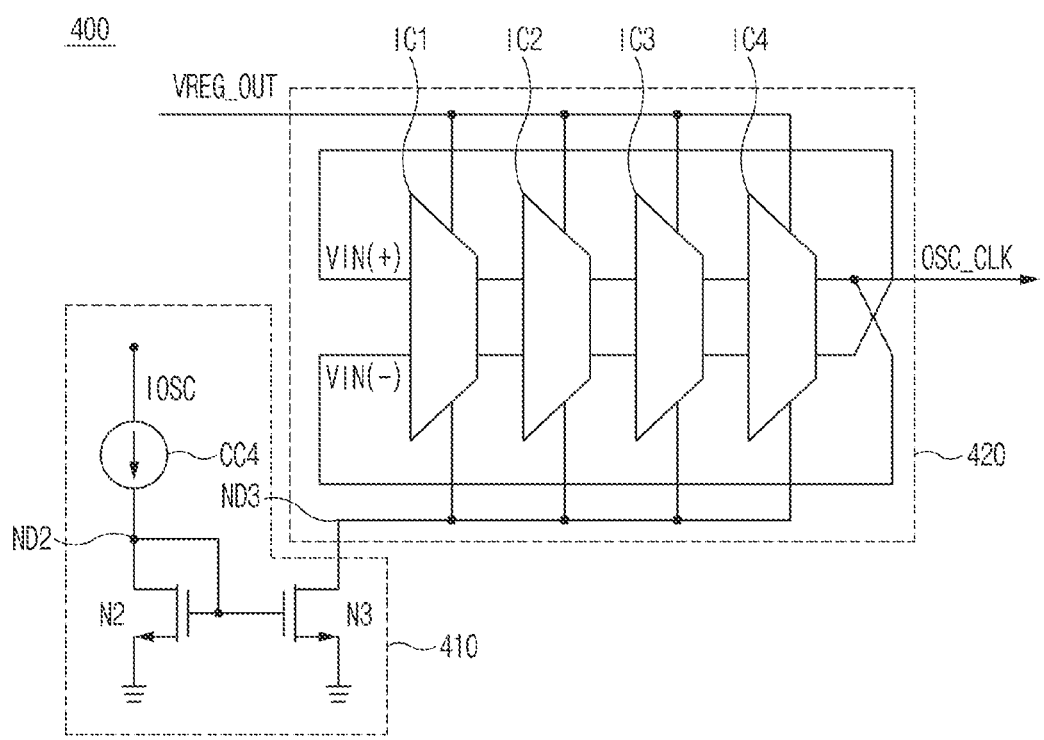
FIG. 5 is a detailed circuit diagram illustrating an example of an oscillation circuit of FIG. 1 based on implementations of the disclosed technology.

FIG. 5 is a detailed circuit diagram illustrating an example of the oscillation circuit 400 of FIG. 1 based on implementations of the disclosed technology.

Referring to FIG. 5, the oscillation circuit 400 may include a mirror circuit 410 and an oscillator 420.

Here, the mirror circuit 410 may mirror a third current IOSC received from the bias circuit 200 and may output the mirrored resultant current to the node ND3. The mirror circuit 410 may mirror the third current IOSC as the operation current of the oscillator 420 and may use the mirrored resultant current. Here, the expression "mirroring" may be a concept that includes not only a concept for enabling the same current to flow through another circuit but also a concept for enabling the magnitude of a current to be multiplied by an invariable number and to flow through another circuit.

The mirror circuit 410 of the oscillation circuit 400 may include a constant current source CC4 and a plurality of NMOS transistors N2 and N3.

The constant current source CC4 may generate a constant current by using the third current IOSC received from the bias circuit 200. The constant current source CC4 may be connected between the third current IOSC input terminal and the node ND2. The NMOS transistor N2 may be connected between the node ND2 and the ground voltage terminal, and an additional connection may be formed so that a gate terminal and a drain terminal of the NMOS transistor N2 can be connected to each other. In addition, the NMOS transistor N3 may be connected between the node ND3 and the ground voltage terminal so that a gate terminal of the NMOS transistor N3 can be connected to the NMOS transistor N2.

In addition, the oscillator 420 may compare differential input signals VIN (+) and VIN (−) with each other in response to the supply voltage VREG_OUT and the output signal of the mirror circuit 410 and may generate the clock signal OSC_CLK as a result of the comparison.

The oscillator 420 may be driven by the supply voltage VREG_OUT and the output current of the mirror circuit 410. Here, the oscillator 420 may be implemented in a ring oscillator structure including a plurality of inverter chains IC1~IC4, each including a plurality of inverters connected in a ring structure.

Here, each of the plurality of inverter chains IC1~IC4 may include a plurality of differential inverters. The oscillator 420 may sequentially generate differential output signals having a constant phase difference in each of the plurality of inverter chains IC1~IC4. Any one of the plurality of inverter chains IC1~IC4 (for example, an inverter chain IC4 of the last stage) may be configured such that output stages of the inverter chain IC4 cross each other and are interconnected to have the opposite phase to that of the input stage of the inverter chain IC1 of the first stage. The clock signal OSC_CLK may be output through the last inverter chain IC4 from among the plurality of inverter chains IC1~IC4.

Although the embodiment of the disclosed technology involves the type of oscillator 420 being implemented as a ring oscillator as an example, other implementations are also possible. In addition, although the embodiment of the disclosed technology involves the oscillator 420 being implemented as a 4-stage differential ring oscillator for convenience of description, other implementations are also possible.

Figure 7:
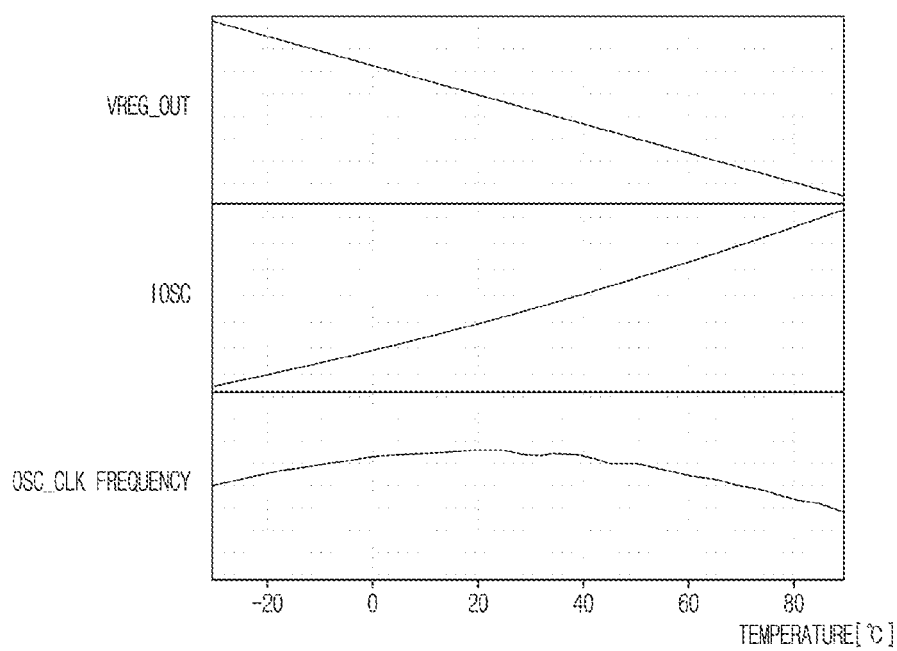

In order for the clock signal OSC_CLK output from the oscillator 420 to have a constant cycle, a bias current that drives the internal circuits (i.e., the plurality of inverter chains IC1~IC4) of the oscillator 420 must be constantly supplied. The amount of the bias current of the oscillator 420 may be adjusted by the third current IOSC received from the bias circuit 200 as shown in FIG. 7.

The reference voltage VREF output from the reference voltage generator 100 may be irrelevant to a temperature change, and the oscillator 420 can be operated by the third current IOSC generated by the reference voltage VREF. Therefore, the ideally operating oscillator 420 may generate the clock signal OSC_CLK having a constant cycle according to the third current IOSC.

However, when the supply voltage VREG_OUT, which is substantially the source power of the oscillator 420, changes according to the use process, environmental factors, and power-supply voltage (especially, temperature, etc.), the amount of current flowing through the internal circuit of the oscillator 420 can be changed.

In other words, when the amount of bias current is changed according to a temperature change in the voltage generator 300, the voltage generator 300 might not stably provide the supply voltage VREG_OUT. Accordingly, the bias current flowing through the oscillator 420 may be variably changed so that the clock signal OSC_CLK might not be constantly output. When the output signal of the oscillator 420 does not have a target frequency, there may be a high possibility of directly causing malfunction to the system. Therefore, characteristics of the oscillator 420 may be referred to as one of the factors that is very important and that greatly affects system performance.

Accordingly, the voltage generator 300, based on implementations of the disclosed technology, may adjust the ratio of the second current I_PTAT that is proportional to temperature based on the constant current source CC2 to the first current I_CTAT that is inversely proportional to temperature based on the constant current source CC3 such that the voltage generator 300 can provide the oscillation circuit 400 with the supply voltage VREG_OUT having a constant slope.

Figure 6:
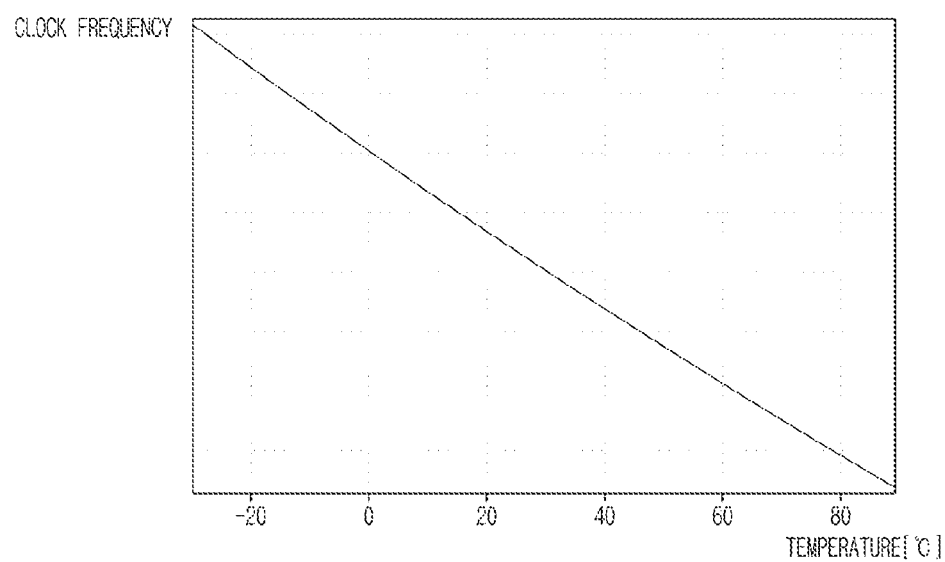
FIGS. 6 and 7 are graphs illustrating examples of operations of the oscillation circuit of FIG. 5 based on implementations of the disclosed technology.

When it is assumed that the supply voltage VREG_OUT of a constant level is supplied to the oscillator 420, the clock signal OSC_CLK output from the oscillator 420 may have a frequency inversely proportional to the temperature as shown in FIG. 6. However, according to the embodiment of the disclosed technology, the amount of bias current flowing through the oscillator 420 may be constantly controlled by the supply voltage VREG_OUT having a slope that constantly decreases in response to the increasing temperature so that it can be seen that the clock signal OSC_CLK output from the oscillator 420 has an almost constant frequency regardless of temperature change as shown in FIG. 7.

Figure 8:
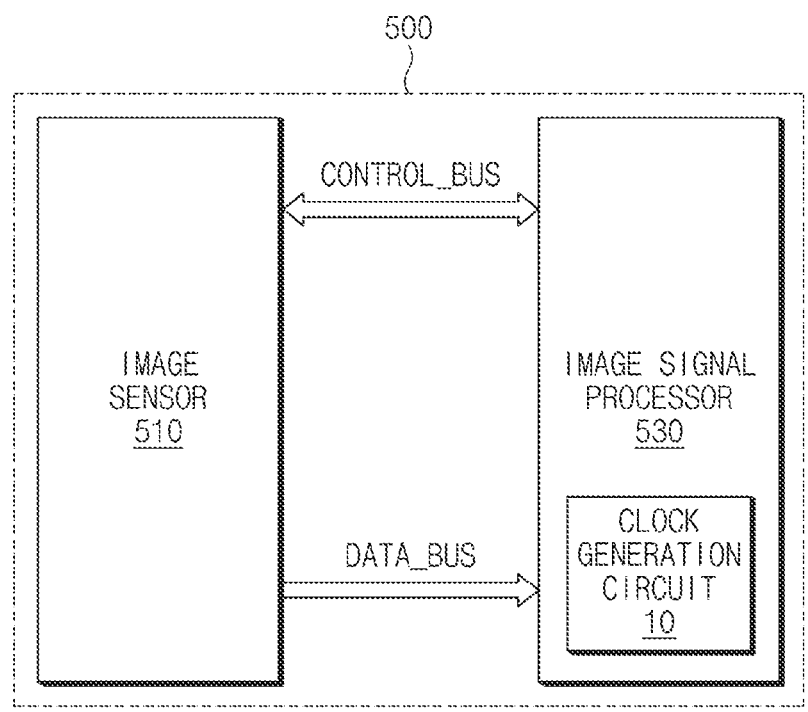
FIG. 8 is a block diagram illustrating an example of an image processing system based on some other implementations of the disclosed technology.

FIG. 8 is a block diagram illustrating an example of an image processing system 500 based on other implementations of the disclosed technology.

The clock generation circuit 10, based on implementations of the disclosed technology, may be used to provide a clock signal or a timing signal to electronic circuits, for example, image processing systems, computers, systems, communication devices, microprocessors, microcontrollers, flip-flop circuits, latch circuits, and the like.

For example, the embodiment of FIG. 8 may indicate that the clock generation circuit 10, based on implementations of the disclosed technology, is applied to the image processing system 500. The image processing system 500 may include an image sensor 510 and an image signal processor 530.

In this case, the image sensor 510 may generate an image by converting light received through a lens into a digital signal. The image sensor 510 may generate an image capable of enabling a face recognition operation or a gesture recognition operation to be performed.

In addition, the image signal processor 530 may control the image sensor 510. A control bus CONTROL_BUS may be a bus for controlling the image sensor 510, and a data bus DATA_BUS may be a bus for transferring an image generated by the image sensor 510.

For example, the image signal processor 530 may perform a face recognition operation or a gesture recognition operation that uses an image generated by the image sensor 510. When a predetermined face is recognized as a result of performing the face recognition operation, that is, when authentication is successfully performed, the system including the image processing system 500 may be unlocked.

Face recognition technology is one technical field of biometrics and refers to technology for enabling a machine to automatically identify and authenticate a person by using unique feature information contained in each person's face. A face recognition function is widely used for the purposes of unlocking portable devices, such as smartphones and computer devices. In order to use the face recognition function for such purposes, i.e., unlocking, the image sensor 510 capable of recognizing each person's face should always be turned on, so that keeping the image sensor 510 always turned on entails a large consumption of current. Since an always-on operation is generally required in recognition devices, low-power operation of the image signal processor 530 is essentially required.

When the clock generation circuit 10, based on implementations of the disclosed technology, is applied to the image signal processor 530, a constant target frequency can be implemented within the image signal processor 530 regardless of PVT changes. Therefore, when it is difficult to receive a clock source from a device external to the image signal processor 530, the image signal processor can generate a clock signal by itself, thereby reducing external power.

As is apparent from the above description, the voltage generator and the clock generation circuit including the same based on implementations of the disclosed technology can efficiently reduce frequency fluctuation of a clock signal affected by PVT changes.

The embodiments of the disclosed technology may provide a variety of effects capable of being directly or indirectly recognized through the above-mentioned patent document.

Although a number of illustrative embodiments have been described, it should be understood that modifications and enhancements to the disclosed embodiments and other embodiments can be devised based on what is described and/or illustrated in this patent document.

What is claimed is:

1. A clock generation circuit comprising:
a reference voltage generator configured to generate a first current having a current value inversely proportional to a reference voltage and a temperature;
a bias circuit configured to generate a bias current, a second current having a current value proportional to the temperature, and a third current based on the reference voltage;
a voltage generator configured to generate a supply voltage based on the first current, the bias current, and the second current; and
an oscillation circuit configured to generate a clock signal having a constant frequency based on the supply voltage and the third current,
wherein the supply voltage is generated to have a slope based on a ratio of the first current to the second current.

2. The clock generation circuit according to claim 1, wherein the slope of the supply voltage constantly decreases as the temperature increases.

3. The clock generation circuit according to claim 1, wherein the reference voltage generator includes:
a bandgap reference circuit configured to output the reference voltage at a predetermined level according to output characteristics in which a negative (−) temperature coefficient and a positive (+) temperature coefficient are offset by each other.

4. The clock generation circuit according to claim 1, wherein the bias circuit includes:
a first comparator configured to compare the reference voltage with a voltage of a first feedback node;
a first drive element, connected between a power-supply-voltage input terminal and the first feedback node, configured to control a bias voltage based on an output signal of the first comparator;
a first resistor connected between the first feedback node and a ground voltage terminal;
a second drive element, connected between the power-supply-voltage input terminal and an output terminal of the second current, configured to control the second current based on the output signal of the first comparator; and
a third drive element, connected between the power-supply-voltage input terminal and an output terminal of the third current, configured to control the third current based on the output signal of the first comparator.

5. The clock generation circuit according to claim 4, wherein the second drive element includes a first transistor, and
wherein the first transistor is configured to determine a value of the second current based on a voltage applied to gate-source terminals thereof.

6. The clock generation circuit according to claim 4, wherein the third drive element includes a second transistor, and
wherein the second transistor is configured to determine a value of the third current based on a voltage applied to gate-source terminals thereof.

7. The clock generation circuit according to claim 1, wherein the voltage generator includes a first constant current source configured to generate a bias voltage based on the bias current.

8. The clock generation circuit according to claim 7, wherein the voltage generator further includes:
a second comparator configured to compare the bias voltage corresponding to the bias current with a feedback voltage received from a second feedback node;
a fourth drive element, connected between a power-supply-voltage input terminal and an output node of the supply voltage, configured to control the supply voltage based on an output signal of the second comparator;
a second resistor connected between the fourth drive element and the second feedback node;
a third resistor connected between the second feedback node and a ground voltage terminal;
a second constant current source, connected between the second feedback node and the ground voltage terminal, configured to generate a constant current by using the second current; and
a third constant current source, connected between the second feedback node and the ground voltage terminal, configured to generate a constant current by using the first current.

9. The clock generation circuit according to claim 8, wherein a voltage division value of the second resistor and the third resistor is provided to the second feedback node and an input terminal of the second comparator.

10. The clock generation circuit according to claim 8, wherein the voltage generator further includes a third transistor and a fourth transistor connected in series between an input terminal of the bias voltage and the ground voltage terminal.

11. The clock generation circuit according to claim 10, wherein each of the third transistor and the fourth transistor is configured such that a drain terminal and a gate terminal thereof are connected to each other.

12. The clock generation circuit according to claim 7, wherein the voltage generator further includes:
a first capacitor connected between an output terminal of the second comparator and an output node of the supply voltage; and
a second capacitor connected between the output node of the supply voltage and the ground voltage terminal.

13. The clock generation circuit according to claim 7, wherein the first constant current source and the second constant current source are connected in parallel to the second feedback node and have different temperature coefficients, and
wherein a current flowing through the second resistor is adjusted based on a ratio of the first current to the second current.

14. The clock generation circuit according to claim 13, wherein a value of the supply voltage is determined to be a sum of a first value and a second value,
wherein the first value is obtained by multiplying the second current by a resistance value of the second resistor, and
wherein the second value is obtained by multiplying a voltage division value of the second resistor and the third resistor by a feedback voltage received from the second feedback node.

15. The clock generation circuit according to claim 1, wherein the oscillation circuit includes:
a mirror circuit configured to mirror the third current and output the mirrored current to a first node; and an oscillator configured to generate the clock signal based on the supply voltage and an output signal of the first node.

16. A voltage generator comprising:
a comparator configured to compare a bias voltage with a feedback voltage received from a feedback node;
a first drive element, connected between a power-supply-voltage input terminal and an output node of a supply voltage, configured to control the supply voltage based on an output signal of the comparator;
a first resistor connected between the first drive element and the feedback node;
a second resistor connected between the feedback node and a ground voltage terminal;
a first constant current source, connected between the feedback node and the ground voltage terminal, configured to generate a constant current by using a first current; and
a second constant current source, connected between the feedback node and the ground voltage terminal, configured to generate a constant current by using a second current.

17. The voltage generator according to claim 16,
wherein the first current has a current value inversely proportional to temperature; and
wherein the second current has a current value proportional to the temperature.

18. The voltage generator according to claim 16, wherein the voltage generator includes:
a third constant current source configured to generate the bias voltage based on a bias current controlled according to a temperature;
a first transistor and a second transistor connected in series between an input terminal of the bias voltage and the ground voltage terminal in a manner in which a drain terminal and a gate terminal of each of the first transistor and the second transistor are connected to each other;
a first capacitor connected between an output terminal of the comparator and an output node of the supply voltage; and
a second capacitor connected between the output node and the ground voltage terminal.

19. The voltage generator according to claim 16, wherein the first constant current source and the second constant current source are connected in parallel to the feedback node and have different temperature coefficients, and
wherein a current flowing through the first resistor is adjusted based on a ratio of the first current to the second current.

20. The voltage generator according to claim 16, wherein a value of the supply voltage is determined to be a sum of a first value and a second value,
wherein the first value is obtained by multiplying a sum of the first current and the second current by a resistance value of the first resistor, and
wherein the second value is obtained by multiplying a voltage division value of the second resistor and the third resistor by the feedback voltage.

* * * * *